United States Patent [19]

Kaye et al.

[11] Patent Number: 4,536,722
[45] Date of Patent: Aug. 20, 1985

[54] APPARATUS FOR RAPIDLY SWITCHING A CONTROLLED SIGNAL SOURCE AND METHOD THEREFOR

[75] Inventors: Lawrence A. Kaye, Walnut Creek; Robert Mayer, Oakland, both of Calif.

[73] Assignee: Giga-Tronics, Inc., Pleasant Hill, Calif.

[21] Appl. No.: 391,229

[22] Filed: Jun. 23, 1982

[51] Int. Cl.³ .............................................. H03L 7/00
[52] U.S. Cl. .................................. 331/117 D; 331/8; 331/14; 331/16; 331/17; 331/36 R; 331/179
[58] Field of Search ............... 331/8, 14, 16, 17, 36 R, 331/36 C, 36 L, 96, 117 D, 179

[56] References Cited

U.S. PATENT DOCUMENTS 4,007,429  2/1977  Cadalora et al. ...................... 331/17
4,219,783  8/1980  Carter et al. ........................ 331/17 X Primary Examiner—Eugene R. LaRoche
Assistant Examiner—Robert J. Pascal
Attorney, Agent, or Firm—Townsend and Townsend

[57] ABSTRACT

In a controlled signal generator or specifically a microwave frequency signal generator, which requires a quieting capacitor, improved switching speed without degrading noise performance is provided by switching out the quieting capacitor during frequency changes, precharging it to the new condition, and then reconnecting it for normal operation. Other error causing current drains are also compensated for.

7 Claims, 5 Drawing Figures

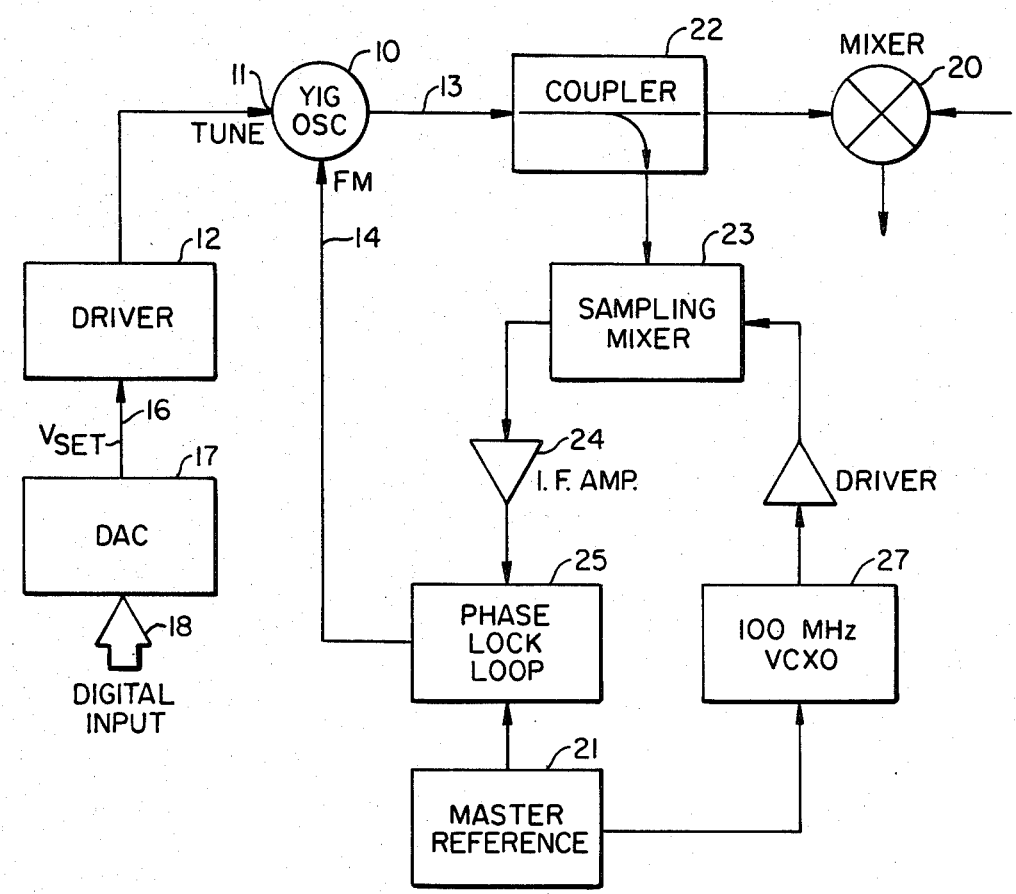
FIG._1.

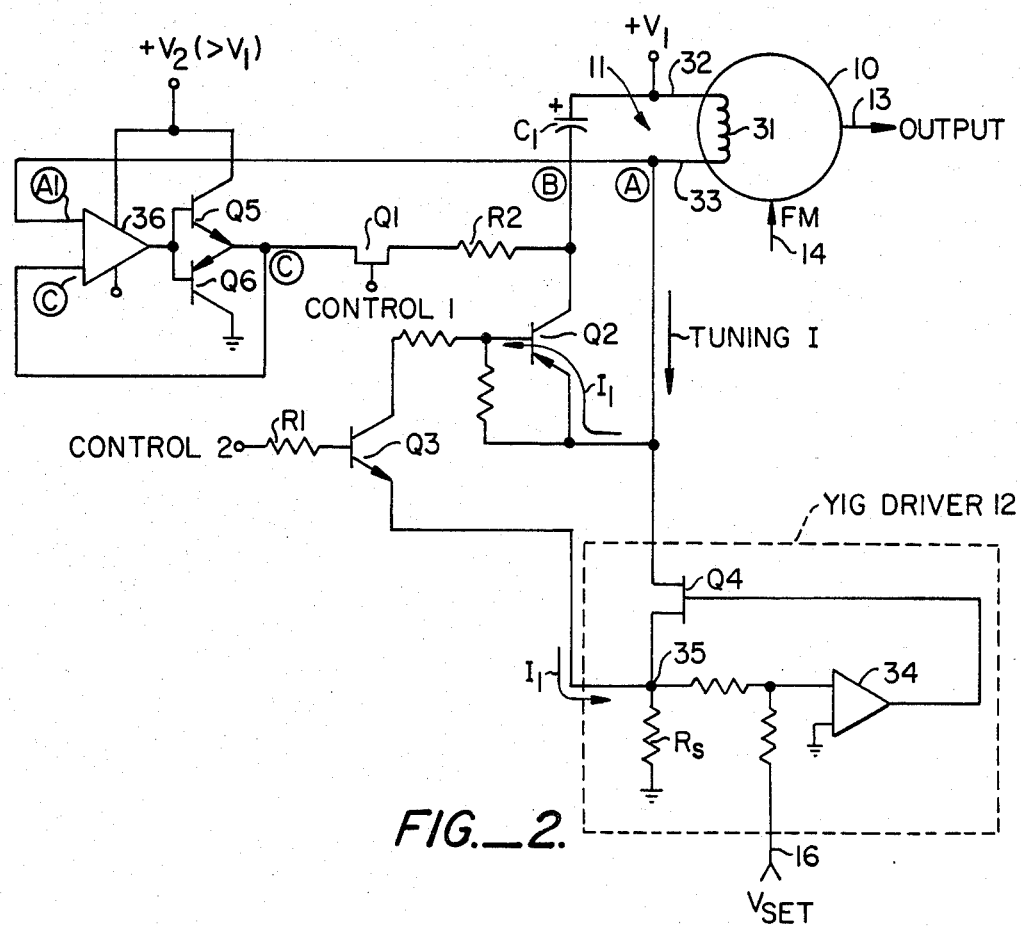
FIG._2.
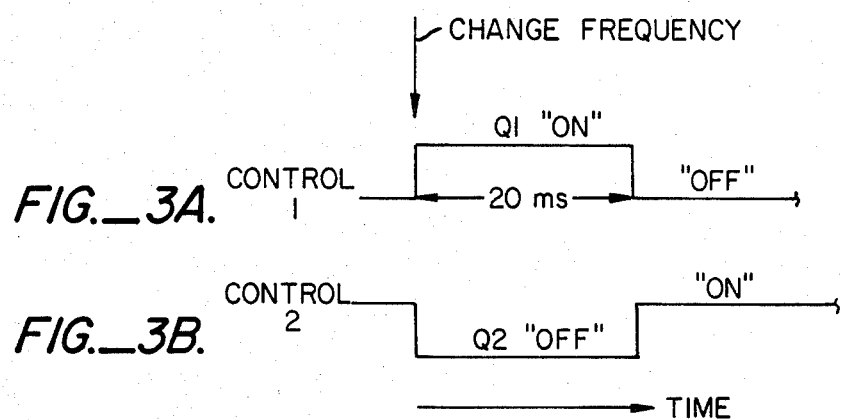
FIG._3A.
FIG._3B.

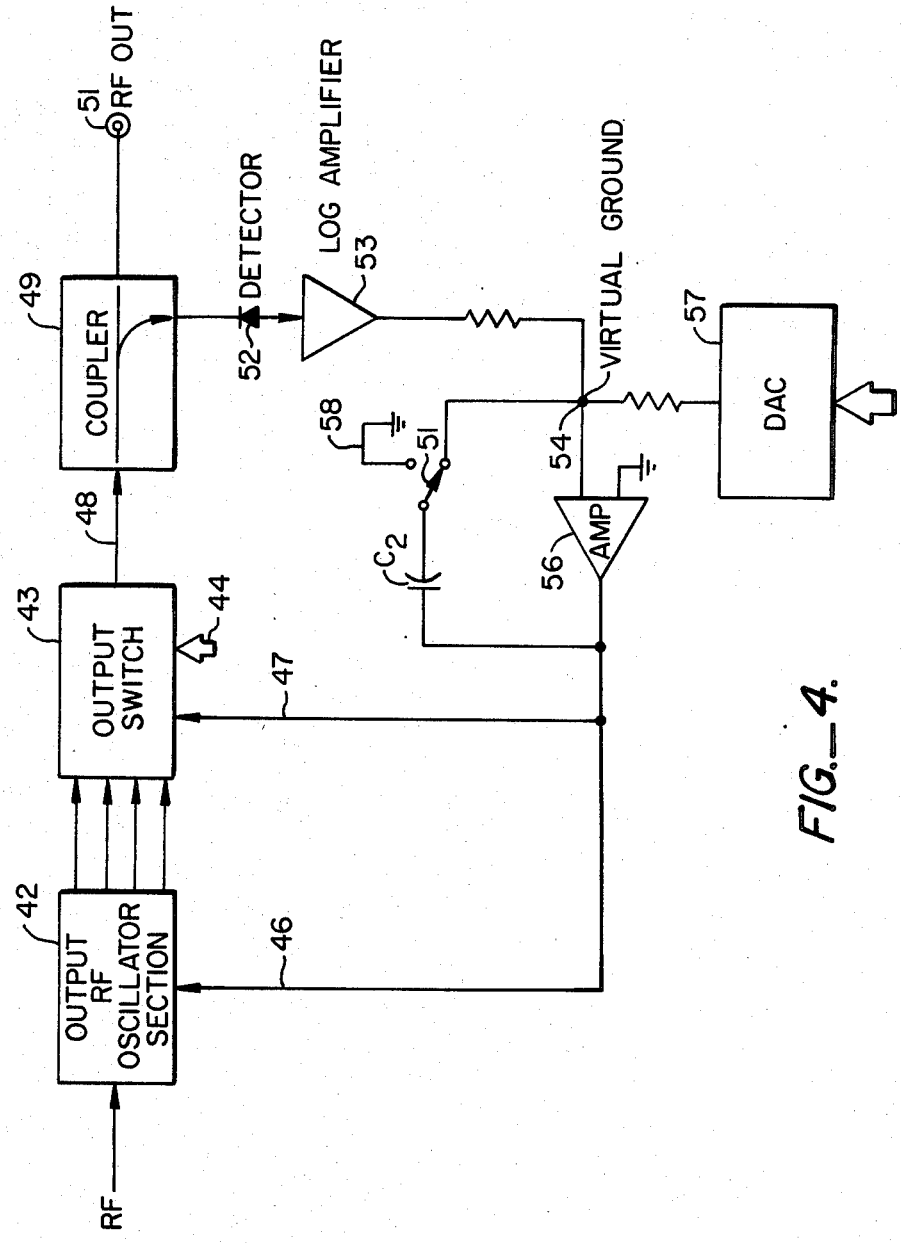
FIG._4.

APPARATUS FOR RAPIDLY SWITCHING A CONTROLLED SIGNAL SOURCE AND METHOD THEREFOR

The present invention is directed to an apparatus for rapidly switching a controlled signal source and method therefor and more specifically to varying a controlled voltage or current source without degrading noise performance.

In any microwave frequency signal generator, especially one using an oscillator which is of the YIG type (yitrium iron garnet), capacitive filtering means is usually required across its input terminals to provide for quieting. This causes a problem because the capacitive filter inherently causes time lag and delay problems when it is desired, for example, to change the frequency. And, in general, the same problem is true in any type of controlled signal source where capacitive filtering is required where some change is desired at the input at which the capacitive filtering is located.

Therefore, it is the general object of this invention to provide an improved apparatus for rapidly switching a controlled signal source and method therefor.

In accordance with the above object, there is provided a controlled signal source having a parameter varied by a control signal applied to an input, the control signal when changed varying the parameter, and which requires capacitive filtering means across the input for quieting. The invention comprises switching means for selectively connecting the filtering means across the input and disconnecting such means during a parameter and control signal change. Means are provided for charging or discharging the capacitive filtering means to substantially match the voltage at the input produced by the change. An equivalent method is also provided.

FIG. 1 is a block diagram of a reference loop portion of a microwave frequency generator which is one embodiment of the present invention.

FIG. 2 is a detailed circuit schematic of a portion of FIG. 1.

FIGS. 3A and 3B are timing diagrams useful in understanding the operation of FIG. 2.

FIG. 4 is a block diagram, partially schematic, of another embodiment of the present invention.

The block diagram of FIG. 1 is actually a reference loop portion of an overall microwave frequency signal generator, synthesizer, and sweeper. This includes a YIG tuned transistor oscillator 10 which, for example, might cover a frequency of 1.9 to 8.7 GHz. It has an input port 11, which is actually a pair of terminals, driven by a constant current generator driver 12 which tunes the oscillator to the desired frequency. The output frequency of the oscillator at 13 is directly proportional to the input current at tuning input 11.

Oscillator 10 also includes an FM input 14 for modulating and slightly changing the output. Control of the current provided by driver 12 is determined by the input 16 designated $V_{set}$. This programmable voltage in turn is provided by a digital-to-analog converter (DAC) 17 having a digital input 18 from a microprocessor control unit (not shown).

The purpose of the circuit shown in FIG. 1 is to provide on the line 19 to the mixer 20 an output in steps of 300 megahertz. In general, and very briefly since this is not a critical part of the invention, the frequency produced at 19 is to be phase locked to the master reference 21. This is accomplished by the feedback loop including the coupler 22, a sampling mixer 23 driving an IF amplifier 24 which in turn drives the phase lock loop 26 which has as its output the FM input 14 to YIG oscillator 10. Sampling mixer 23 is driven by a 100 megahertz voltage controlled crystal oscillator 27.

FIG. 2 illustrates the YIG oscillator 10, the output 13, its FM input 14 and its tunable input 11. In addition, there is the driver unit 12 which has as its output the tuning current I, the magnitude thereof being determined by the $V_{set}$ input 16. The driver 12 is in effect a voltage controlled constant current source.

In the YIG oscillator 10, the tuning coil is actually a copper coil illustrated at 31 which is interior to the oscillator. It has a pair of floating input terminals 32 and 33, terminal 32 being connected to a positive voltage $V_1$ and the other terminal 33 being connected to YIG driver or constant current source 12. The current through the tuning coil 31 is shown as Tuning I.

A noise filter in the form of a capacitor $C_1$ is connected directly to one terminal 32 and to the other terminal 33 of coil 31 through a transistor switch Q2.

Referring to driver unit 12, as discussed, the $V_{set}$ input on line 16 is determined by a microprocessor and driven to different voltage levels to produce different frequencies. This $V_{set}$ voltage is compared to a voltage across the resistor $R_s$, a sensing resistor, which is connected to input terminal 33 through a power type field effect transistor Q4. Thus, the amount of voltage across $R_s$ is directly proportional to the tuning current (and, as will be discussed below, it takes into account the current drain of the switching transistor Q2). If there is any difference between the voltage $V_{set}$ and across $R_s$, it is amplified by the amplifier 34 to drive FET Q4 accordingly to reduce the voltage difference. A feedback loop is created when one terminal of Q4 is connected back to the common node 35 at $R_s$.

To disconnect $C_1$ from the circuit during tuning current (frequency) changes, there are switching means which include transistors Q2 and Q3. Q3 is a Darlington device with extremely high current gain. This, thus, allows the current change to be made much more rapidly. At the same time, the present invention provides that in order to avoid a surge of charging current which would cause a momentary frequency excursion if the capacitor $C_1$ were merely reconnected, the capacitor is precharged to the voltage at coil 31. In effect, as indicated on the drawing, the voltage at point B approaches that of point A. This is accomplished during the switching mode by a change frequency indication from the microprocessor which is indicated in FIGS. 3A and 3B. At this time, a control voltage 1 turns transistor Q1 on or conductive and biases Q2 off. This effectively disconnects capacitor $C_1$ from its normal connection in parallel with coil 31. In this mode of operation, the comparator 36 on its "C" input senses the voltage, by means of the conductive switch Q1 and the resistor $R_2$, at point B; and also the new voltage in the coil 31 being caused by this frequency change at its other input A1. This causes the bipolar transistors Q5 and Q6, which are connected to point C and to Q1, to charge or discharge the capacitor $C_1$ so the voltage across it substantially matches or approaches the voltage across tuning coil 31. Note that the supply voltage $V_2$ for the comparator 36 and the transistors Q5 and Q6 is greater than the voltage $V_1$ which is at the upper terminal 32 of coil 31. As indicated in FIG. 3A, a sufficient time, for example, 20 milliseconds is allowed to elapse so that the new frequency change is settled and the capacitor of $C_1$ has been charged or discharged appropriately. Then, as shown in FIG. 3B, Q2 is switched on and Q1 is switched off, to again place capacitor $C_1$ in parallel with tuning coil 31; in other words, the normal mode of operation.

Thus, in partial summary, the rapid tuning of the YIG tuned oscillator to a desired frequency has been accomplished by switching the capacitor $C_1$ out of the circuit, allowing the tuning to proceed rapidly while precharging the capacitor $C_1$ so that no momentary frequency excursion takes place. This is especially important, for example, in the circuit of FIG. 1 where a phase locked loop is present and any surge might cause the phase lock to be broken by the frequency being pulled out.

To avoid degrading the tuning accuracy of the driver 12 (since frequency is directly proportional to the tuning current), the emitter base current of Q2, designated as $I_1$, is returned via the transistor Q3 to the current sensing resistor $R_s$ at node 35. Thus, all current flowing in the tuning coil 31 will be sensed by $R_s$.

The only other remaining possible error current, that is, the base current of transistor Q3, is insignificant since Q3 is a Darlington transistor and has a $\beta$ of approximately 10,000. Also its base input resistor $R_1$ is a very large value, for example, 10 megohms.

The disconnecting of the comparator 36 and its associated bipolar transistors Q5 and Q6 by Q1 is required during normal operation since otherwise the current drain by this circuit would be a significant percentage of the tuning current of the YIG device and thus cause significant error.

Another factor in the invention is that the oscillator tuning coil 31 must be driven by a constant current source to maintain accuracy as the coil impedance varies considerably with temperature changes. In addition, of course, the comparator means when charging or discharging the capacitor utilizes a current source independent of the constant current source so as not to affect the tuning linearity.

As is implicit from the discussion of FIG. 2, the terminals 32 and 33 are effectively floating. Terminal 32 is connected to a positive voltage, and terminal 33 to the non-grounded side of the driver 12. Thus, when the capacitive filter $C_1$ is connected across the inputs of the tuning coil in parallel, only one side of the capacitor, that is, at point B, is switched. Also, since only one side of capacitor $C_1$ is switched, this requires by necessity the bipolar transistors Q5 and Q6 for charging and discharging.

FIG. 4 in contrast illustrates a somewhat simpler embodiment which utilizes the concept of the present invention. Here there is a quieting capacitor $C_2$ which is used for reducing noise in the levelling system of another portion of the microwave frequency synthesizer of the present invention. Referring generally to the block diagram circuit, a radio frequency (RF) signal drives an output RF oscillator section 42 which in turn drives an output switch 43. Both of these can be varied by a microprocessor input 44 and control inputs 46 and 47 to determine the final power level at the output 48. A directional coupler 49 and detector 52 sense this output, and the final output of the generator is shown at 51. Coupler 49 has its output split off to detector 52, amplified by logarithmic amplifier 53 which then drives the summing junction 54 of the operational amplifier 56. The capacitor $C_2$ is connected from the input to the output of the operational amplifier via a switch S1. The position shown is the normal operating position which reduces noise or provides quieting.

Feedback capacitor $C_2$, in its normal operating position, causes amplifier 56 to operate as an integrator. This will reduce short-term variations in the output. However, this prevents a rapid change in the output of amplifier 56 when a change in the output voltage of DAC 57 is programmed by the microprocessor. To avoid this slow change, capacitor $C_2$ must be disconnected from summing junction (virtual ground) 54. During the time that $C_2$ is disconnected from virtual ground 54, it is connected instead to a true ground (58) to allow it to be rapidly charged by the output of amplifier 56. This maintains the voltage on the S1 side of $C_2$ at zero volts so that no transient is produced when S1 is returned to its normal operating position.

Thus, an improved apparatus for rapidly switching a controlled signal source and method therefor has been provided. As is apparent, the invention is applicable to switching any controlled signal source where noise performance must be maintained.

What is claimed:

1. In a microwave frequency signal generator having an oscillator which requires capacitive filtering means to reduce noise, said oscillator being driven and tuned by a constant current source so that the output frequency of said oscillator is proportional to the current from said constant current source:
   a pair of current inputs for said oscillator connected to said constant current source;
   means included in said current source for changing the magnitude of said current and therefore the output frequency of said oscillator;
   switching means for selectively connecting said filtering means across said input pair and disconnecting said filtering means during a said frequency change; and
   comparator means for sensing the voltage across said oscillator input pair, comparing the oscillator input voltage with the voltage across said filtering means, and charging or discharging said filtering means to substantially match said oscillator input voltage.

2. A generator as in claim 1 where said constant current source is responsive to a predetermined input voltage for changing its output current and includes a feedback loop for comparing its output with said input voltage and where said switching means draws a control current which forms part of the current driving said oscillator, and including sensing means, which form a part of said feedback loop, for summing said control current in a common node of said constant current source whereby the linearity of tuning is maintained.

3. A generator as in claim 2 where said switching means includes a Darlington circuit for limiting current drains.

4. A generator as in claim 1 including second switching means for disconnecting said comparator means except during said frequency changes.

5. A generator as in claim 1 where said oscillator input pair is connected to a copper coil sensitive to temperature and therefore requiring said constant current source.

6. A generator as in claim 1 where said comparator means utilizes a current source independent of said constant current source.

7. A generator as in claim 1 where said capacitive filtering means and said oscillator input pair are in parallel and only one side of said filtering means is switched.

* * * * *